United States Patent
Kurosaki

[11] Patent Number: 5,903,501
[45] Date of Patent: May 11, 1999

[54] SEMICONDUCTOR DEVICE WITH 3V/5V TOLERANT OUTPUT DRIVER

[75] Inventor: Kazuhide Kurosaki, Kawasaki, Japan

[73] Assignee: Fujitsu Limited, Kawasaki, Japan

[21] Appl. No.: 09/007,073

[22] Filed: Jan. 14, 1998

[30] Foreign Application Priority Data

Jul. 8, 1997 [JP] Japan .................................... 9-182826

[51] Int. Cl.[6] .............................. G11C 16/04; G11C 7/00
[52] U.S. Cl. ................................ 365/189.05; 365/189.11; 365/226
[58] Field of Search .......................... 365/189.05, 189.11, 365/226, 229, 230.06, 230.08; 326/21, 24, 81, 83

[56] References Cited

U.S. PATENT DOCUMENTS 5,381,059  1/1995  Douglas ..................................... 326/21
5,587,671  12/1996 Zagar et al. ............................. 326/83
5,631,579  5/1997  Miki et al. ................................ 326/83

FOREIGN PATENT DOCUMENTS 1-245615  9/1989  Japan .

*Primary Examiner*—David Nelms
*Assistant Examiner*—Trong Phan
*Attorney, Agent, or Firm*—Armstrong, Westerman, Hattori, McLeland, & Naughton

[57] ABSTRACT

An output driver circuit provided with a pull-up pMOS transistor and a pull-down nMOS transistor also includes an nMOS transistor connected between the pMOS transistor and an output. A step-up unit is provided for stepping up a gate voltage of the nMOS transistor when high data is to be output.

6 Claims, 13 Drawing Sheets

SEMICONDUCTOR DEVICE WITH 3V/5V TOLERANT OUTPUT DRIVER

BACKGROUND OF THE INVENTION

1. Field of the Invention

The present invention generally relates to output driver circuits in a semiconductor device and, more particularly, to an output driver circuit provided in a 3V device and enabling connection between a 3V device and a 5V device.

2. Description of the Related Art

Recently, 3V devices and 5V devices coexist in some semiconductor devices. In such a case, an output driver connectable with both types of devices is used.

An output driver circuit for a 3V device may be composed of a pMOS transistor and an nMOS transistor. The drain of the pMOS transistor and the drain of the nMOS transistor are both connected to an input/output terminal. The input/output terminal is connected to a data bus. In such a construction, when a 5V signal arrives via the data bus, the 5V signal applies a forward voltage to a PN junction between the drain of the pull-up pMOS transistor and the n-well thereof, resulting in a leak current flowing in the junction.

FIGS. 1 and 2 show examples according to the related art for resolving the problem of leak current.

An output driver circuit of FIG. 1 comprises an output buffer 1, a step-up circuit 2, a pull-up nMOS transistor 3 and a pull-down nMOS transistor 4 connected in series. The source of the nMOS transistor 3 and the drain of the nMOS transistor 4 are connected to an input/output (I/O) terminal 5. The I/O terminal 5 is connected to a data bus.

The output buffer 1 receives an output enable signal /OE and data. The output buffer 1 outputs a signal for driving the step-up circuit 2 to a DPU node and supplies a voltage to be applied to the gate of the nMOS transistor 4, to a DPD node. The step-up circuit 2 controls the nMOS transistor 3 by outputting a voltage to be applied to the gate of the pull-up nMOS transistor 3, to a VPUMP node. More specifically, in a stand-by mode, a prime voltage VSS is applied to the gate of the pull-up nMOS transistor 3 and the gate of the pull-down nMOS transistor 4. When high data is to be output, the voltage VSS is raised to VCC and further stepped up to a voltage sufficiently high to turn on the nMOS transistor 3. In this way, a voltage drop in the nMOS transistor 3 is prevented so that the voltage VCC is properly output via the data bus.

When low data is to be output, the voltage output to the DPD node causes the pull-down nMOS transistor 4 to be turned on so that the voltage on the data bus is pulled down to the ground potential. In this state, the pull-up nMOS transistor 3 is turned off.

When high data is to be output, the pull-up nMOS transistor 3 is turned on by receiving the step-up voltage via the VPUMP. As a result, the I/O terminal 5 is connected to the predetermined voltage VCC. Accordingly, the voltage of the data bus is pulled up to VCC. In this state, the pull-down nMOS transistor 4 is turned off.

Since the nMOS transistor 3 in FIG. 1 is an nMOS transistor, it has a p-well instead of an n-well. Accordingly, the problem of leak current is avoided.

FIG. 2 shows another construction according to the related art for implementing 3V/5V tolerant input/output.

An nMOS transistor 14 is provided between a pull-up pMOS transistor 13 and a input/output terminal 16 of an output driver. An output buffer 11 receives an output enable signal /OE and data. The output buffer 11 controls the pull-up pMOS transistor 13 by outputting a voltage to be applied to the gate of the pull-up pMOS transistor 13, to a DPU node, and also controls the pull-down nMOS transistor 15 by outputting a voltage to be applied to the gate of the pull-down nMOS transistor 15. The step-up circuit 12 continually applies a sum of the voltage VCC and a threshold voltage Vth to the gate of the nMOS transistor 14. With this, when a 5V signal arrives via the data bus in a stand-by mode, the voltages at the gate and the drain of the nMOS transistor 14 cancel each other. Accordingly, the drain of the pull-up pMOS transistor 13 is not supplied with a voltage high enough to cause a leak current to flow.

In the construction of FIG. 1, 3V/5V tolerant I/O is implemented by preventing a leak current from flowing when a 5V signal arrives in a 3V device and by stepping up the gate voltage of the pull-up nMOS transistor when high data is to be read out. However, such an arrangement for reading out high data requires raising the gate voltage of the pull-up nMOS transistor 3 to VCC and then to the step-up voltage. As a result, a step-like output waveform is produced and access is slowed down. If an operation of raising the voltage from VSS to VCC and then raising the voltage VCC to a step-up voltage is performed in a short period of time in an attempt to prevent access from being slowed down, an excessive variation in the current results so that noise may be produced.

In the construction of FIG. 2, since the gate of the nMOS transistor 14 is continually maintained at VCC+Vth current consumption in a stand-by mode is relatively large. Further, since the gate of the nMOS transistor 14 is pulled up only to the level of VCC+Vth, the size of the nMOS transistor 14 should be relatively large in order to obtain a reduced access time.

SUMMARY OF THE INVENTION

Accordingly, a general object of the present invention is to provide a semiconductor device in which the aforementioned problems are eliminated.

Another and more specific object of the present invention is to provide a semiconductor device provided with a 3V/5V tolerant output driver circuit capable of preventing leak current and reducing current consumption.

The aforementioned objects can be achieved by a semiconductor device provided with an output driver circuit having a pull-up pMOS transistor and a pull-down nMOS transistor, the semiconductor device comprising: an nMOS transistor connected between the pMOS transistor and an output; and a step-up circuit for stepping up a gate voltage of the nMOS transistor when high data is to be output.

According to the semiconductor device of the present invention, the pull-up nMOS transistor is not directly connected to the output. In a chip stand-by mode, the drain voltage of the pull-up nMOS transistor is not raised to a level that causes a leak current to flow. Accordingly, leak current is prevented and current consumption is reduced.

The step-up circuit may step up the gate voltage of the nMOS transistor when high data is to be output, before the pMOS transistor is turned on.

According to this aspect of the invention, a delay is provided before the pMOS transistor is turned on in order to prevent a through current in a data readout mode. By raising the gate voltage of the pull-up nMOS transistor to a step-up voltage before the pMOS transistor is turned on, increase in access time in the output stage is prevented when the high data is to be read out. By controlling a variation in the current using the pMOS transistor, noise is successfully prevented. Since the voltage applied to the gate of the pull-up nMOS transistor is a step-up voltage, the size of the pull-up nMOS transistor can be relatively small.

The step-up circuit may comprise: a step-up circuit activated in a chip active mode so as to output a step-up voltage; and a switching circuit for delivering the step-up voltage output by the step-up circuit to the gate of the nMOS transistor, in accordance with an output enable signal.

According to this aspect of the invention, leak current is prevented and current consumption is reduced.

The step-up circuit of the step-up circuit may step up the gate voltage of the nMOS transistor only when high data is to be output.

According to this aspect of the invention, current consumption is further reduced.

The step-up circuit may comprise a gate voltage switching circuit for switching between first and second outputs depending on output of one of high data and low data, and the nMOS transistor between the pMOS transistor and the output is self-boosted when the high data is to be output.

According to this aspect of the invention, the step-up circuit can be omitted so that the construction of the output driver circuit is simplified and current consumption is reduced.

The aforementioned objects can also be achieved by a semiconductor memory device comprising: a memory cell for storing information; a control circuit for controlling storage of the information in the memory cell; a data latch circuit for latching data from the memory cell in accordance with a control signal from the control circuit; and an output driver circuit composed of a pull-up pMOS transistor and an pull-down nMOS transistor, for outputting data supplied via the data latch circuit to an external semiconductor device, wherein the semiconductor memory device further comprises an nMOS transistor connected between the pMOS transistor and an output, and a step-up circuit for stepping up a gate voltage of the nMOS transistor when high data is to be output.

According to the semiconductor memory device of the present invention, leak current is prevented and current consumption is reduced.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

Figure 1:
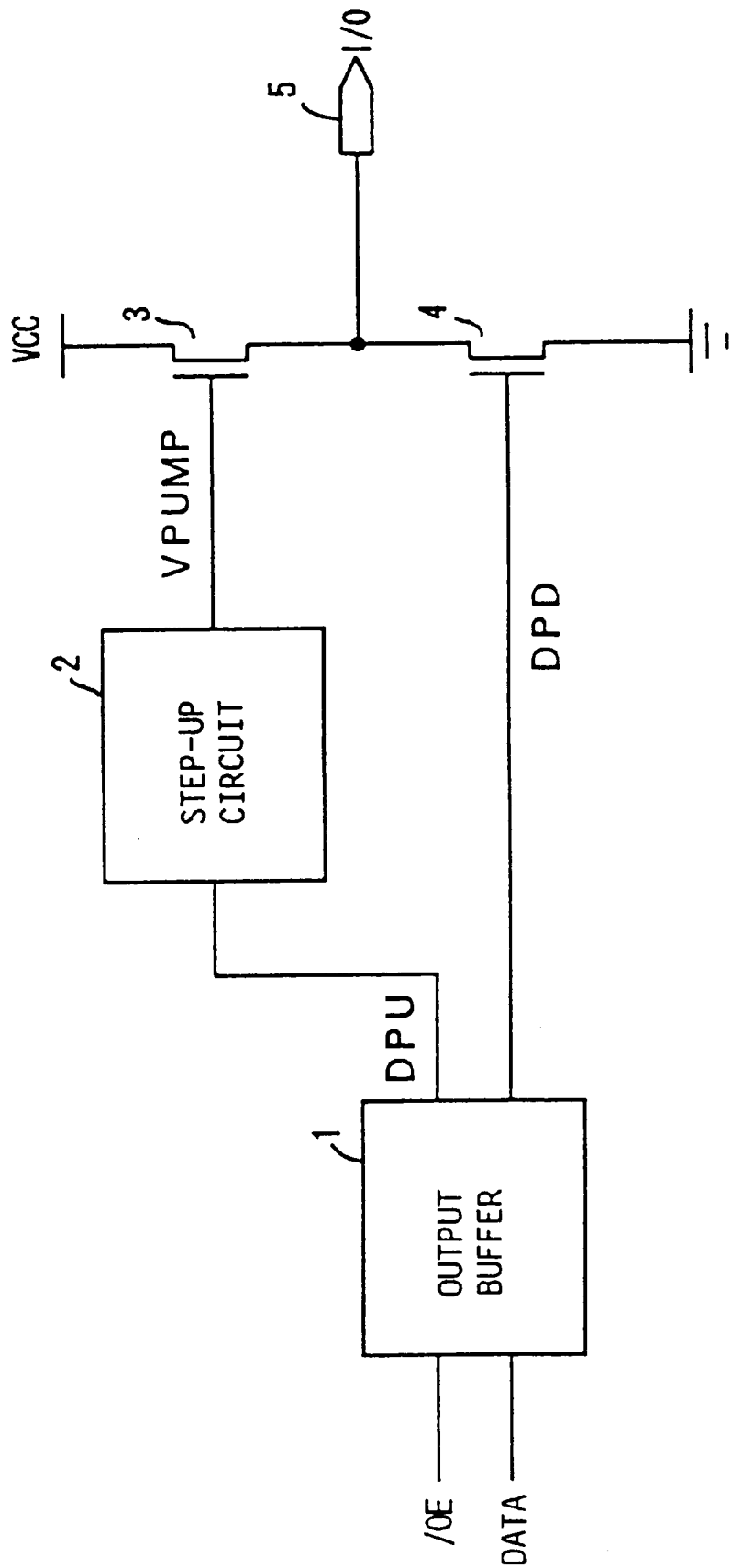
FIG. 1 shows a construction of an output driver circuit according to the related art.
Figure 2:
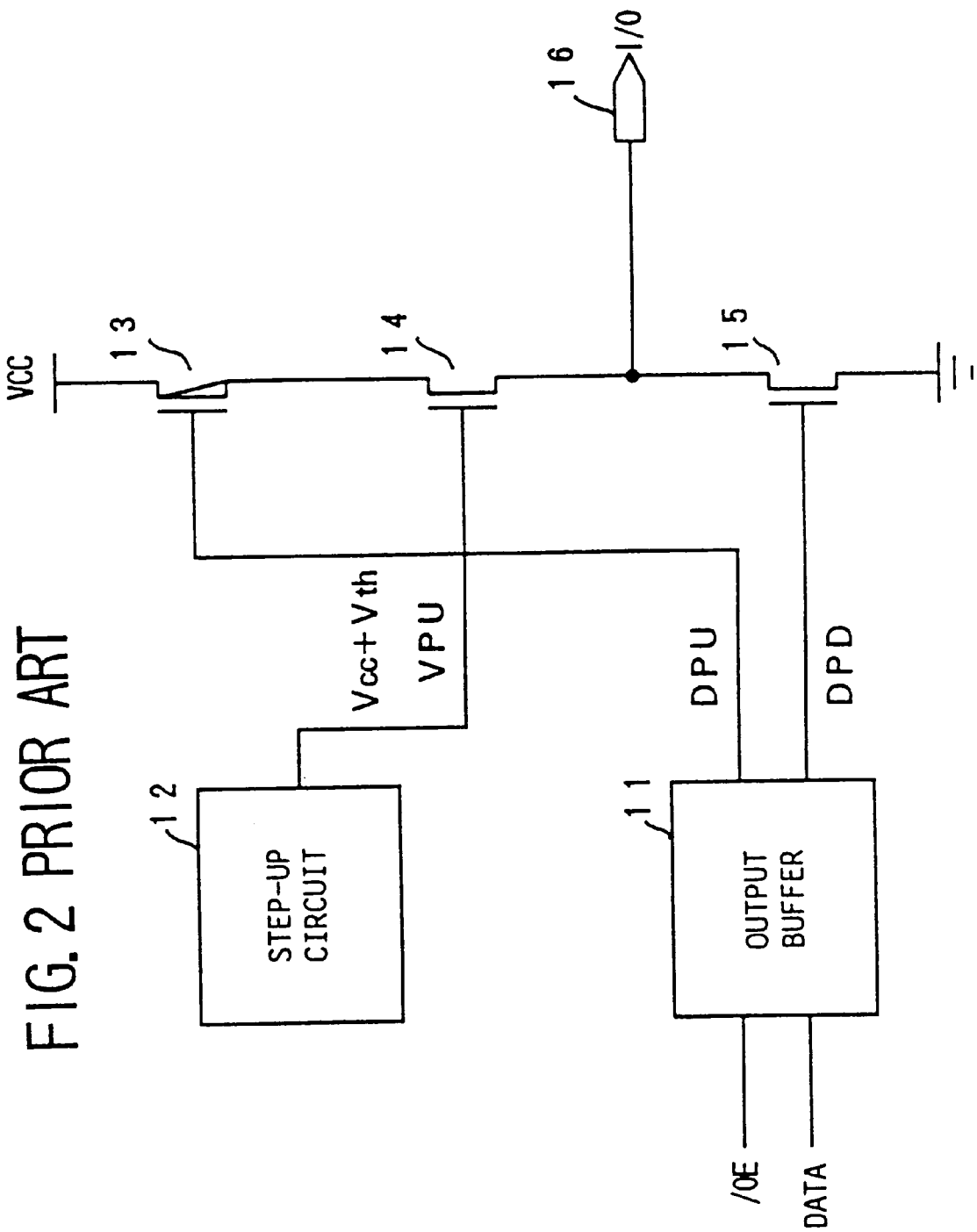
FIG. 2 shows a construction of another output driver circuit according to the related art.
Figure 3:
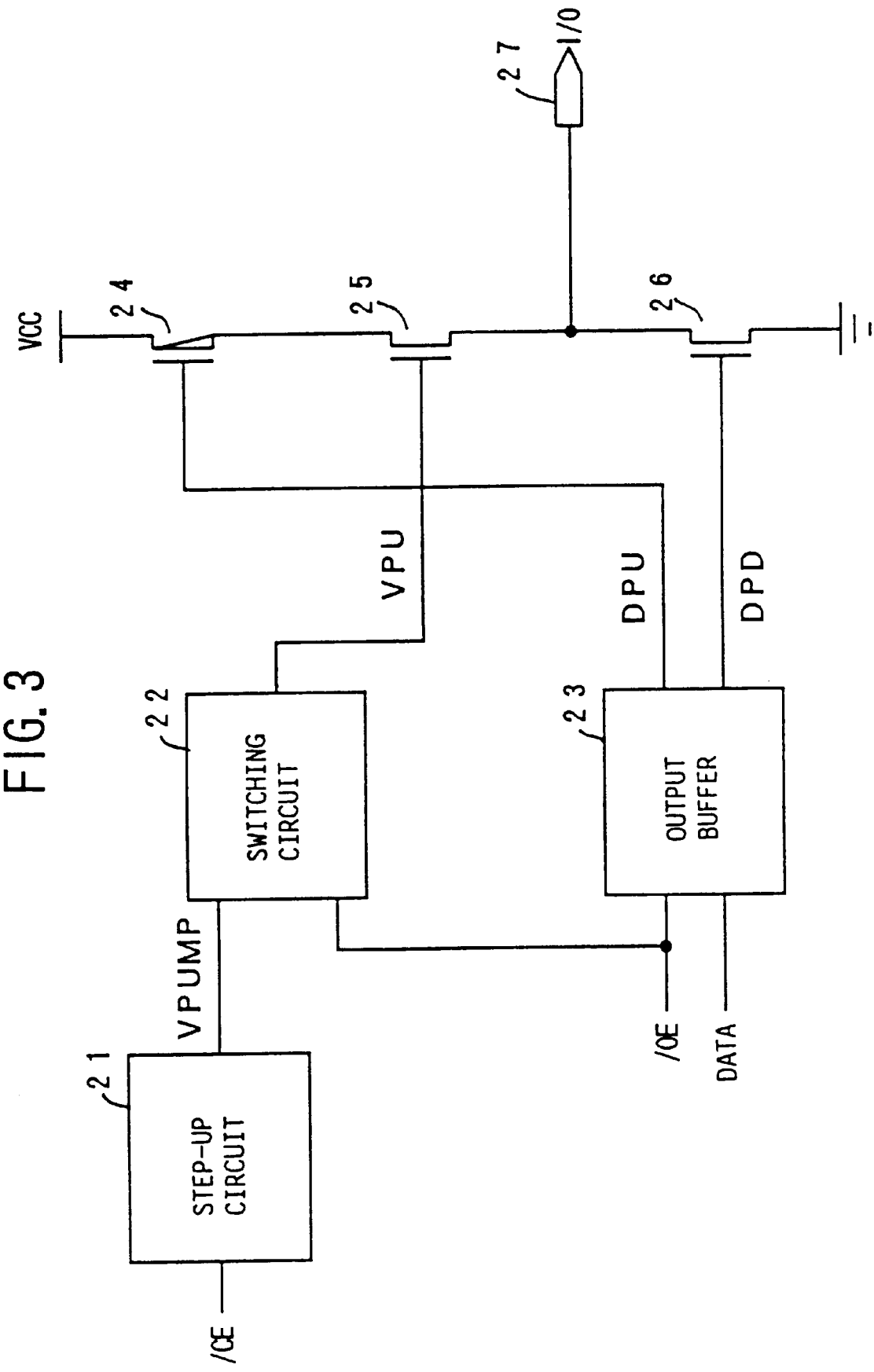
FIG. 3 is a block diagram showing an output driver circuit according to a first embodiment of the present invention.

FIG. 3 is a block diagram showing an output driver circuit of a semiconductor device according to a first embodiment of the present invention.

Referring to FIG. 3, the semiconductor device comprises an nMOS transistor 25 provided between a pMOS pull-up transistor 24 and an output. When high data is to be read out, a step-up circuit 21 outputs a voltage (step-up voltage) for stepping up the gate voltage of the nMOS transistor 25, to a VPUMP node and a VPU node. The gate of the nMOS transistor 25 is prevented from being continually stepped up by providing a switching circuit 22 connected to the step-up circuit 21. In a chip standby mode (when a chip enable signal /CE is high so that the chip is turned off), the voltage supplied to the gate of the pull-up nMOS transistor 25 via the VPU node is maintained at VCC by the switching circuit 22. Even when a 5V signal arrives at the output, a forward bias voltage is not applied between the drain of the pMOS transistor 24 and the n-well thereof so that no leak current flows, because the drain voltage of the pull-up nMOS transistor 24 is at VCC–Vth. In a chip active mode, the chip enable signal (/CE) causes the step-up circuit 21 to produce a step-up voltage higher than the voltage VCC. Responsive to an output enable signal (/OE), the switching circuit 22 is turned on so that the step-up voltage is applied to the gate of the transistor 25. When high data is to be read out, the voltage output to the DPU node causes the pull-up nMOS transistor 24 to be turned on. The output current occurring when the high data is output is controlled by the pull-up nMOS transistor 24 so that a variation in the output current is reduced and noise is prevented from occurring. The operation of a pull-down nMOS transistor 26 is the same as that of the related art so that description thereof is omitted.

Figure 6:
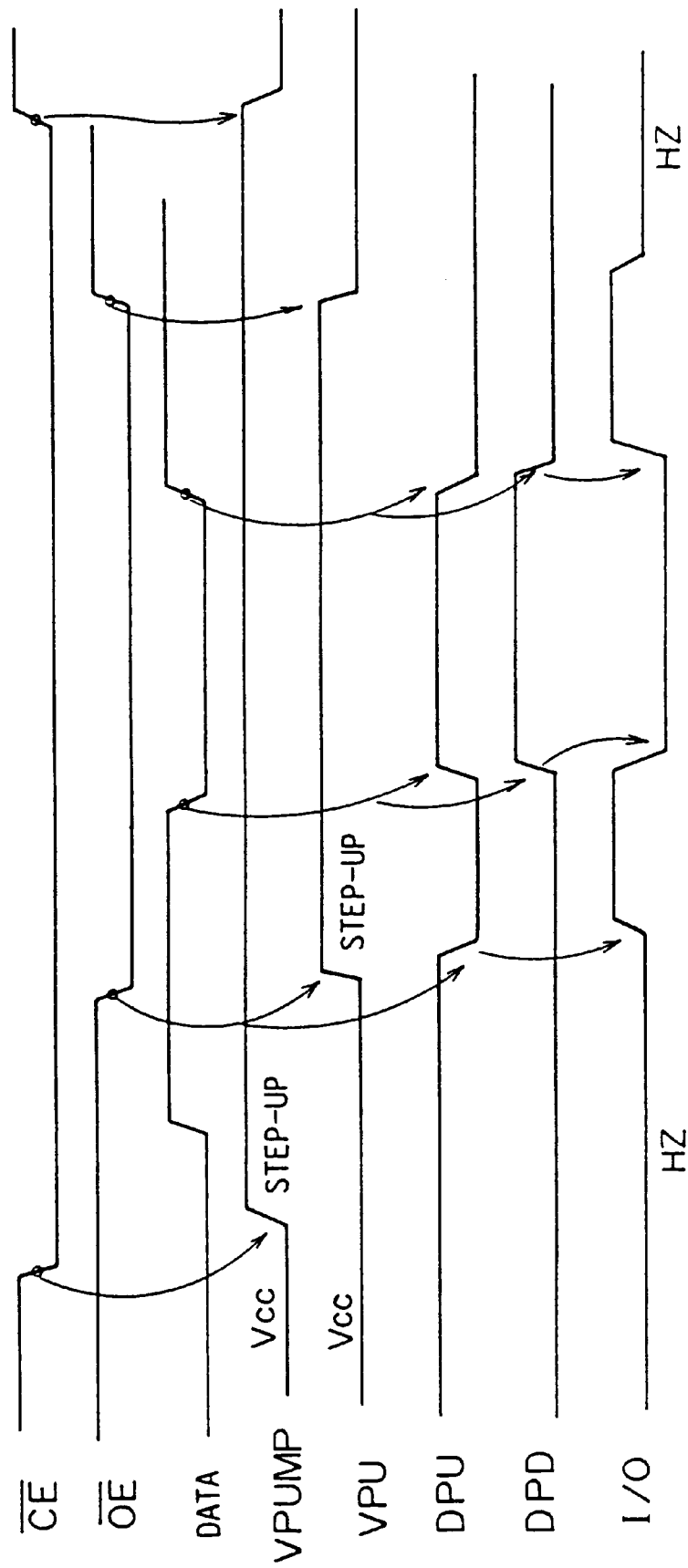
FIG. 6 is a waveform chart showing an operation of the output driver circuit of FIG. 3.

FIG. 6 is a waveform chart showing an operation of the output driver circuit of FIG. 3.

When the chip enable signal /CE goes low, the voltage at the VPUMP node is raised by the step-up circuit 21 (described later with reference to FIG. 4) from VCC to the step-up voltage. When data goes high, the output enable signal /OE goes low after a predetermined delay. With this, the switching circuit 22 (described later with reference to FIG. 5) switches to the step-up circuit 21 so that the voltage at the VPU node is stepped up to the step-up voltage. When the output enable signal /OE goes low, the output buffer 23 causes the voltage at the DPU node to go low so that the pull-up pMOS transistor 24 is turned on. Accordingly, the high data is output to the data bus. When the data goes low, the voltage output by the output buffer 23 to the DPU node goes high so that the pull-up pMOS transistor 24 is turned off. Simultaneously, the voltage at the DPD node is raised so that the pull-down nMOS transistor 26 is turned on and the low data is output via the data bus. Thus, the semiconductor device shown in FIG. 3 can promptly switches an output thereof depending on the level of the data. Since the voltage from the step-up circuit 21 is supplied to the nMOS transistor 25 only when the output is enabled, current consumption is reduced.

Figure 4:
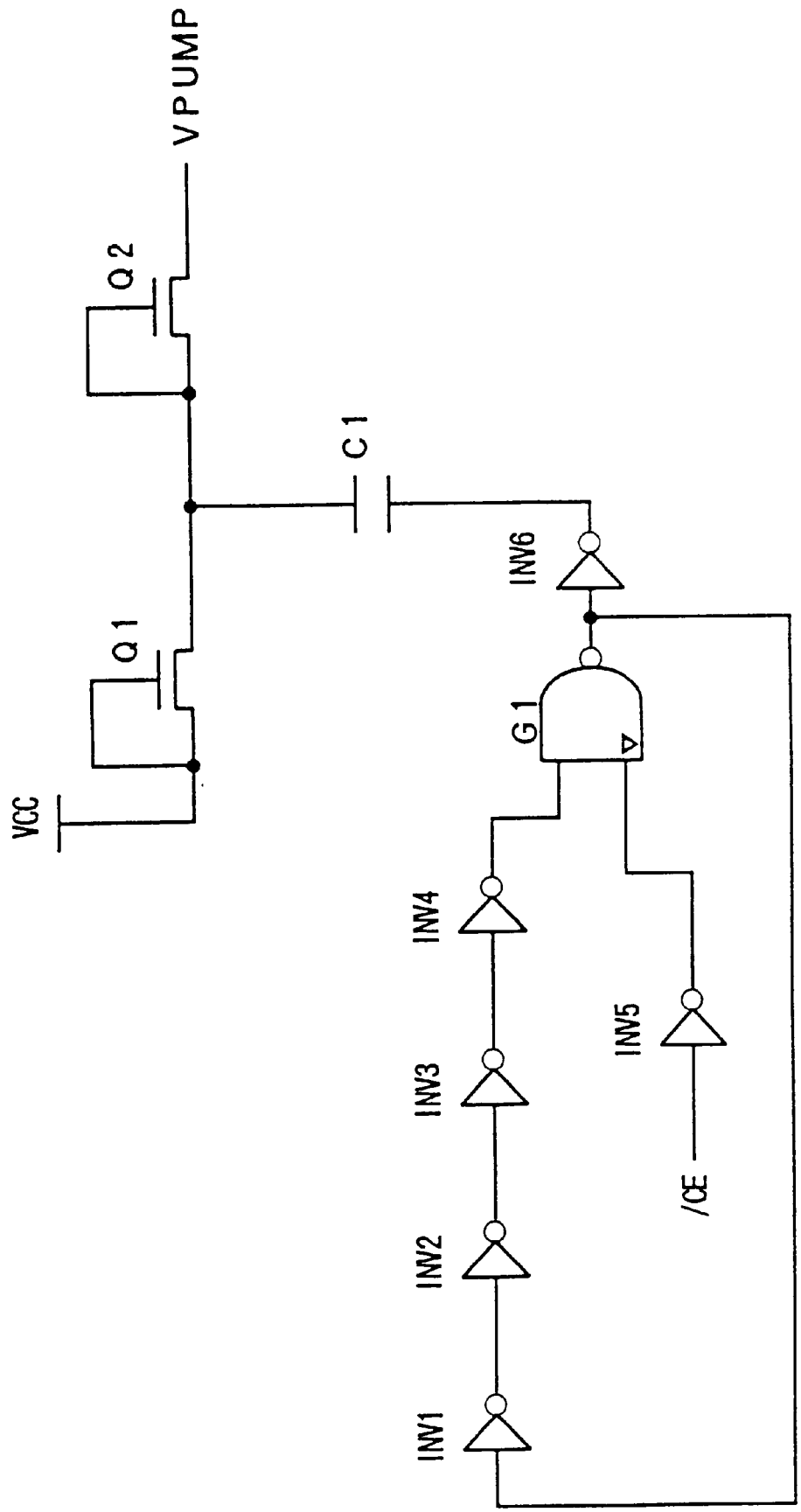
FIG. 4 shows a step-up circuit of the output driver circuit shown in FIG. 3.

FIG. 4 shows a construction of the step-up circuit 21 of FIG. 3. Inverters INV1, INV2, INV3 and INV4 are connected in series. The output of the inverter INV4 is connected to one of the inputs of a NAND gate G1. The chip enable signal /CE is fed to the inverter INV5 and the output of the inverter INV5 constitutes the other input to the NAND gate G1. The output of the NAND gate G1 is fed to the inverter INV1 and to the inverter INV6. The output of the inverter INV6 is supplied to the gates of an nMOS transistor Q1 and an nMOS transistor Q2 via a capacitor C1.

The voltage VCC is output to the VPUMP node via the nMOS transistors Q1 and Q2. When the chip enable signal /CE goes high, the output of the inverter INV 5 goes low so that the output of the NAND gate G1 goes high. The output of the inverter INV6 goes low so that the capacitor C1 is charged. No step-up operation is performed.

When the chip enable signal /CE goes low, the output of the inverter INV5 goes high. Since the immediately preceding output of the NAND gate G1 is high, the high output is fed back to the input of the NAND gate G1 via the inverters INV1, INV2, INV3 and INV4. Therefore, both of the inputs to the NAND gate G1 are high so that the output of the NAND gate G1 goes low. Accordingly, the output of the inverter INV6 goes high (the voltage VCC) so that the charge built up in the capacitor C1 is added to the VPUMP node via the nMOS transistor Q2. Thus, the step-up voltage VCC+VC (the charge voltage of the capacitor C1) is supplied to the VPUMP node.

Figure 5:
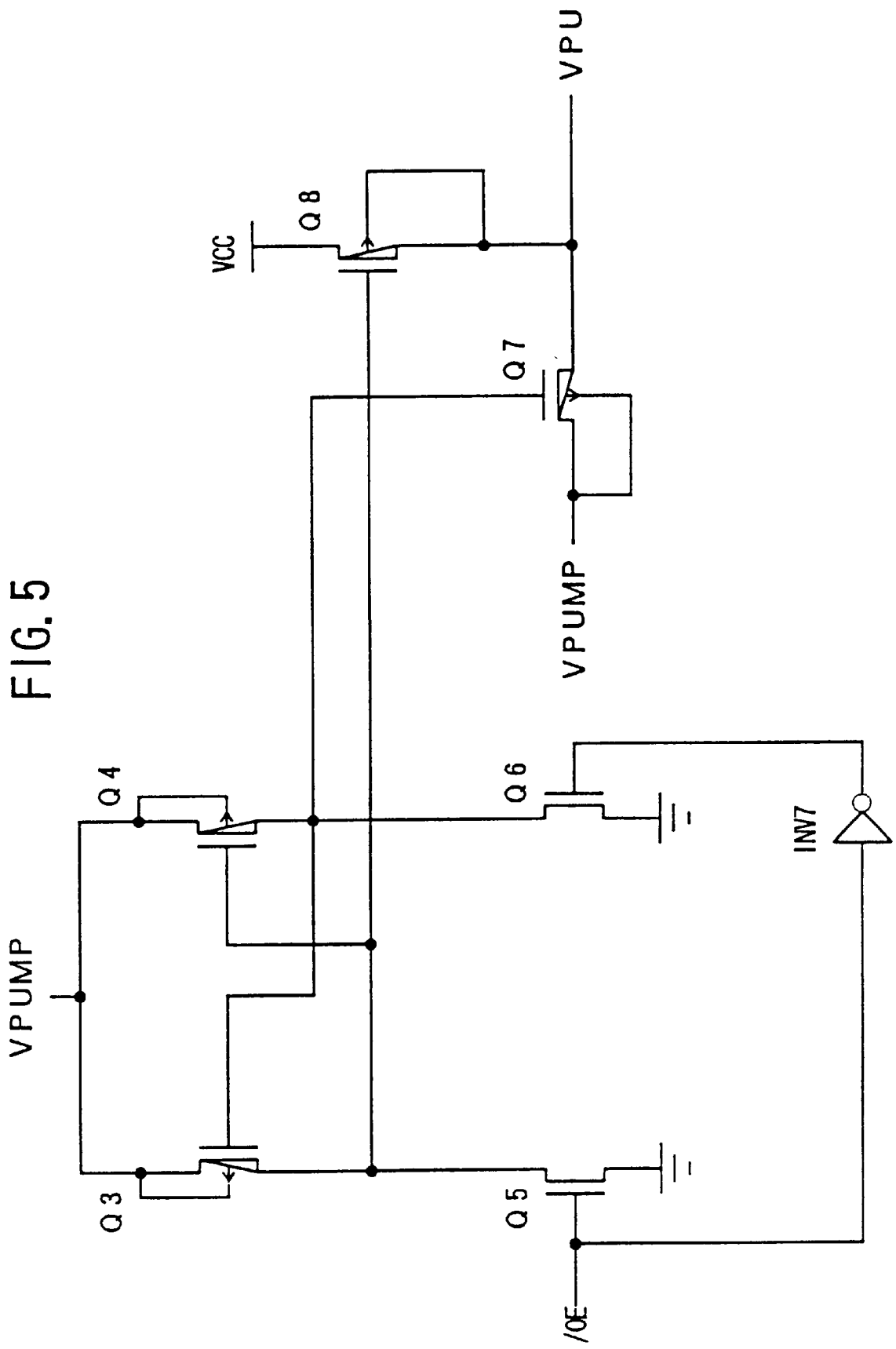
FIG. 5 shows a switching circuit of the output driver circuit shown in FIG. 3.

FIG. 5 shows a construction of the switching circuit 22 of FIG. 3. An nMOS transistor Q5 and a pMOS transistor Q3 are connected in series such that the source of the nMOS transistor Q5 is grounded. An nMOS transistor Q6 and a pMOS transistor Q4 are connected in series such that the source of the nMOS transistor Q6 is grounded. The gate of the pMOS transistor Q3 is connected to the drains of the pMOS transistor Q4 and the nMOS transistor Q6 in series and is also connected to the gate of a pMOS transistor Q7. The gate of the pMOS transistor Q4 is connected to the drains of the pMOS transistor Q3 and the nMOS transistor Q5 connected in series and is also connected to the gate of a pMOS transistor Q8. The source of the pMOS transistor Q3 and the source of the pMOS transistor Q4 are connected to the VPUMP node. The source of the pMOS transistor Q7 is connected to the VPUMP node and the source of the pMOS transistor Q8 is connected to the voltage VCC. The drains of the pMOS transistor Q7 and the pMOS transistor Q8 are connected to the VPU node. The output enable signal /OE is supplied to the gate of the nMOS transistor Q5 and is input to an inverter INV7. The output of the inverter INV7 is supplied to the gate of the nMOS transistor Q6.

The switching circuit 22 operates so as to supply the voltage VCC to the VPU node when the output enable signal /OE is high and supplies the step-up voltage VCC+VC at the VPUMP node of the VPU node when the output enable signal /OE is low.

When the output enable signal /OE is high, the nMOS transistor Q5 is turned on and the nMOS transistor Q6 is turned off. Since the nMOS transistor Q5 is turned on, the gates of the pMOS transistor Q4 and the pMOS transistor Q8 are connected to the ground potential, and the pMOS transistor Q4 and the pMOS transistor Q8 are turned on. Since the step-up voltage supplied via the VPUMP node occurs at the drain of the pMOS transistor Q4 and is supplied to the gate of the pMOS transistor Q7, the pMOS transistor Q7 is turned off. Therefore, only the voltage VCC is applied to the VPU node via the pMOS transistor Q8 which is turned on. The step-up operation is not performed.

When the output enable signal /OE goes low, the nMOS transistor Q5 is turned off and the nMOS transistor Q6 is turned off. Since the nMOS transistor Q6 is turned off, the pMOS transistor Q3 and the pMOS transistor Q7 are turned on. Since the step-up voltage supplied via the VPUMP node occurs at the drain of the pMOS transistor Q3 and supplied to the gate of the pMOS transistor QS, the pMOS transistor Q8 is turned off. Therefore, the step-up voltage supplied via the VPUMP node is applied to the VPU node via the pMOS transistor Q7 which is turned on. Thus, the step-up operation is performed.

Figure 7:
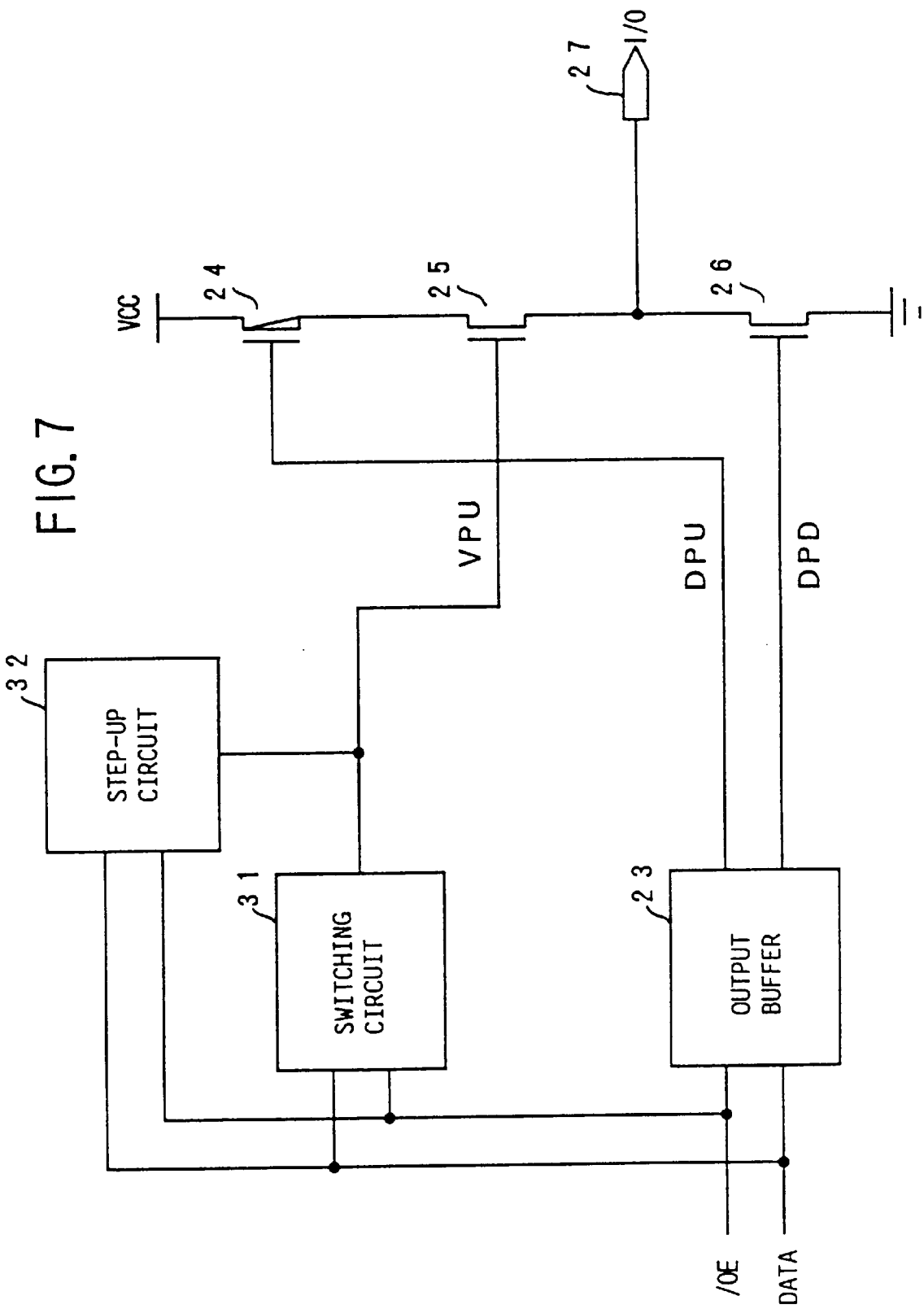
FIG. 7 is a block diagram showing an output driver circuit according to a second embodiment of the present invention.

FIG. 7 is a block diagram showing a construction of an output driver circuit of a semiconductor device according to a second embodiment of the present invention. In FIG. 7, those components that correspond to the components of FIG. 3 are designated by the same reference numerals and the description thereof is omitted.

While the switching circuit 22 in the construction of FIG. 3 operates irrespective of data, the switching circuit 31 of FIG. 7 is constructed to receive data. Only when the output enable signal /OE goes low and when data goes high, the switching circuit 31 causes a step-up circuit 32 to output the step-up voltage to the VPU node. The voltage at the gate of the pull-up nMOS transistor 25 is stepped up only when the high data is output. As compared to the construction of the first embodiment shown in FIG. 3 where the step-up circuit 21 is operating while the chip is active, current consumption is reduced because the step-up voltage is provided only when the high data is output.

Figure 9:
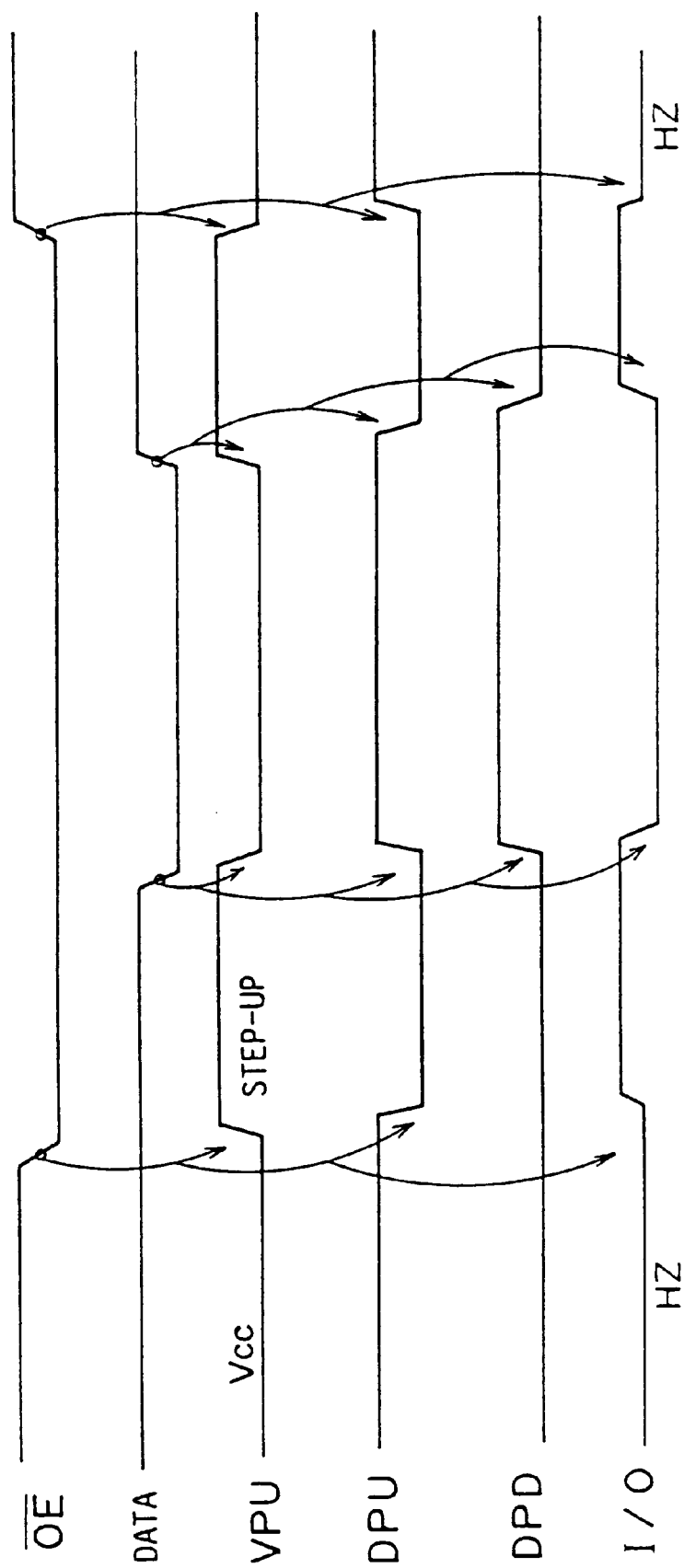
FIG. 9 is a waveform chart showing an operation of the output driver circuit of FIG. 7.

FIG. 9 is a waveform chart describing an operation of the output driver circuit according to the second embodiment.

Figure 13:
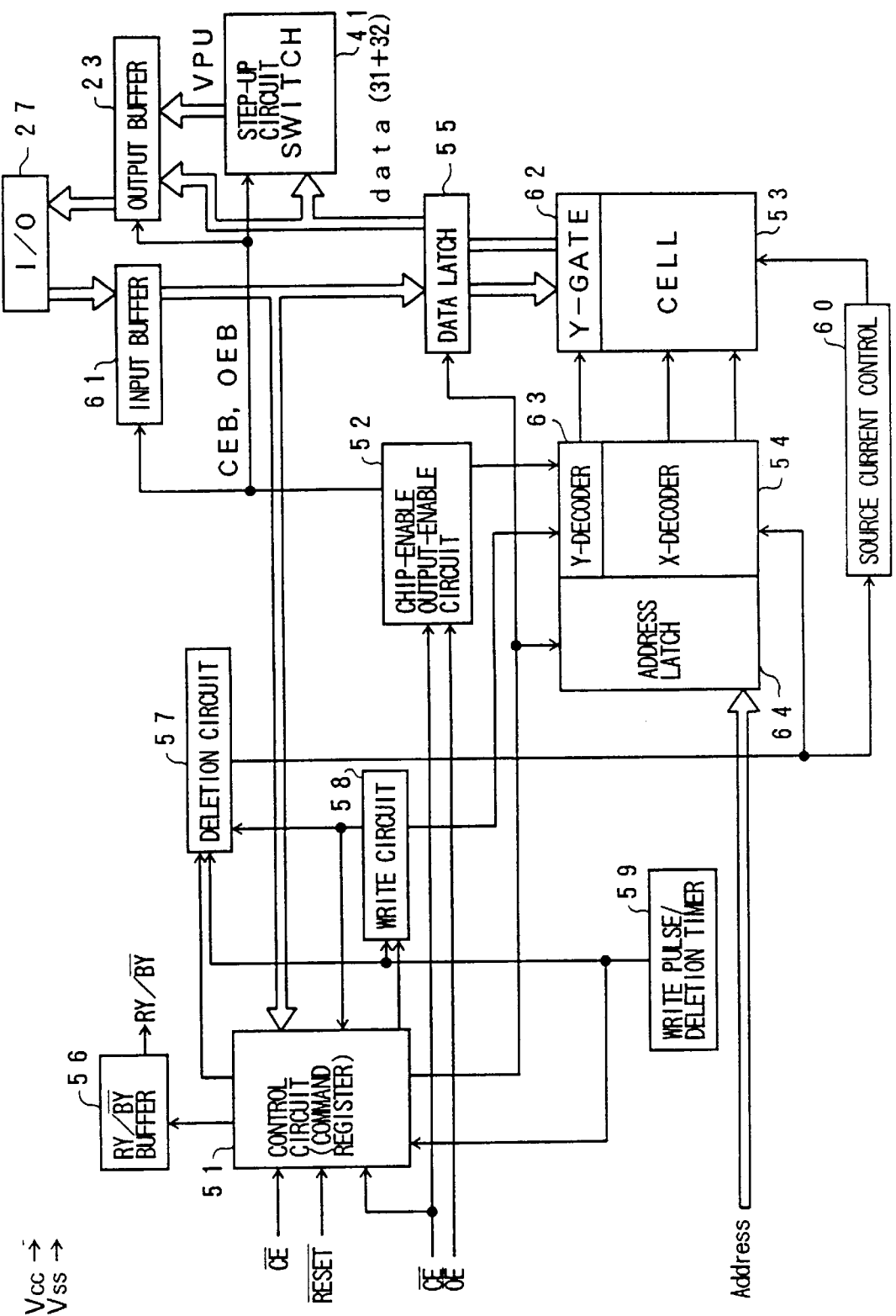
FIG. 13 shows a construction of a semiconductor device to which the output driver according to the present invention is applied.

When the output enable signal /OE (indicated as OEB in the block diagram of FIG. 13 showing the entirety of a semiconductor device) goes low, and when the data goes high, the VPU node is disconnected from the voltage VCC by the switching circuit 31 (described later with reference to FIG. 8) so that the step-up circuit 32 supplies the step-up voltage to the VPU node. The output buffer 23 supplies the voltage VSS to the DPU node and the DPD node. Thus, the high data is output via an input/output terminal 27. Since the voltage at the gate of the pull-up nMOS transistor 25 is stepped up, no voltage drop occurs in the pull-up nMOS transistor 25 so that the voltage VCC is properly output to the data bus.

When the data goes low, the voltage at the VPU node is not stepped up. That is, the voltage VCC occurs at the VPU node. The output buffer provides the voltage VCC to the DPU node and the DPD node so that the low data is output via the input/output terminal 27. Thus, the output driver circuit of FIG. 7 can promptly switch an output thereof depending on the level of the data. Since the step-up circuit provides the step-up voltage from the step-up circuit only when the data is high, current consumption is further reduced.

Figure 8:
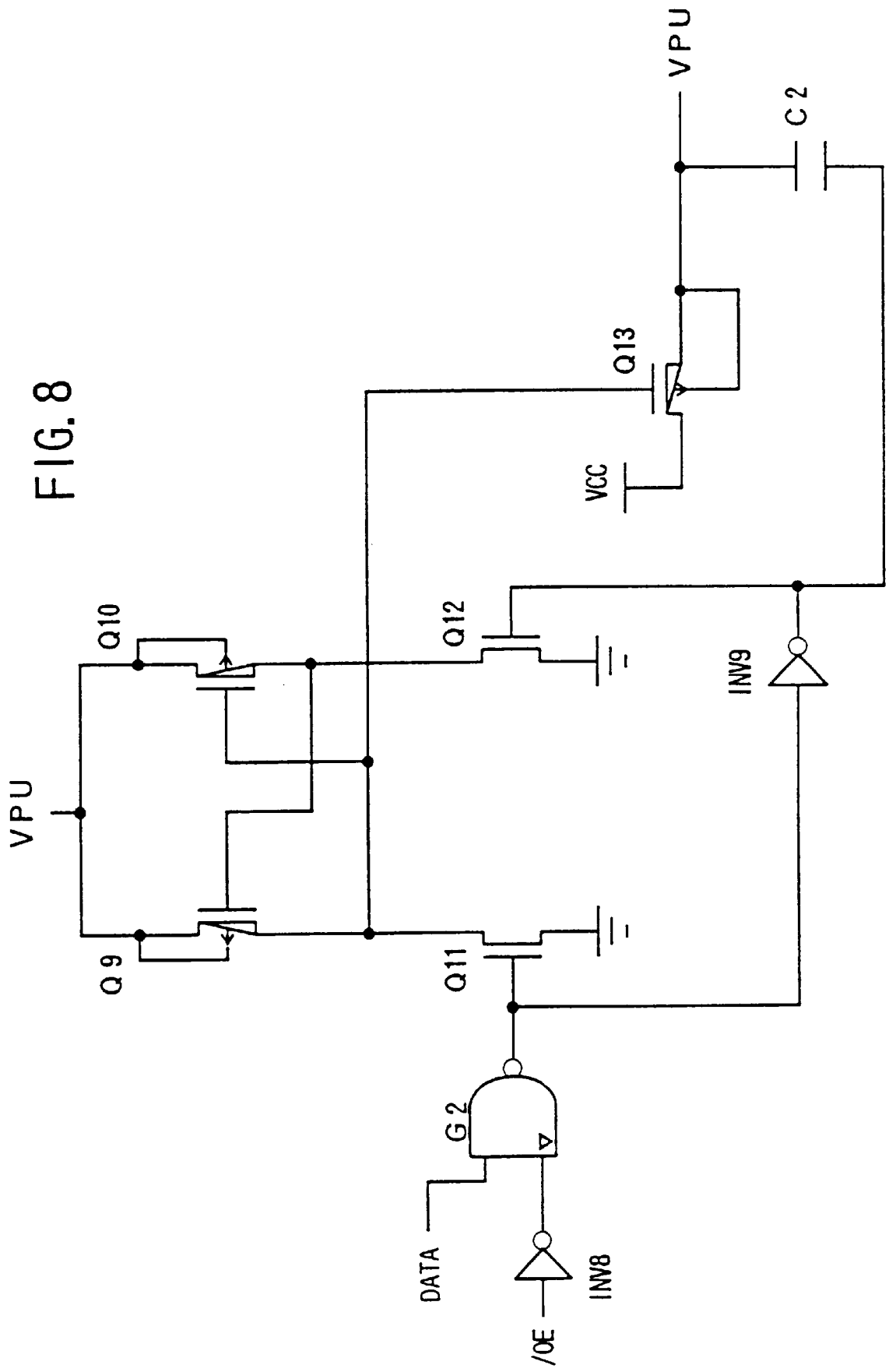
FIG. 8 shows a step-up circuit and a switching circuit of the output driver circuit of FIG. 7.

FIG. 8 shows the switching circuit 31 and the step-up circuit 32 of FIG. 7. The output enable signal /OE is input to an inverter INV8 and the output of the inverter INV8 is fed to one of the inputs to the NAND gate G2. A data signal constitutes the other input to the NAND gate G2. An nMOS transistor Q11 and a pMOS transistor Q9 are connected in series such that the source of the nMOS transistor Q11 is grounded. An nMOS transistor Q12 and a pMOS transistor Q10 are connected in series such that the source of the nMOS transistor Q12 is grounded. The gate of the pMOS transistor Q9 is connected to the drains of the pMOS transistor Q10 and the nMOS transistor Q12 connected in series. The gate of the pMOS transistor Q10 is connected to the drains of the pMOS transistor Q9 and the nMOS transistor Q11 connected in series and is also connected to the gate of the pMOS transistor Q13. The source of the pMOS transistor Q9 and the source of the pMOS transistor Q13 are connected to the VPU node. The voltage VCC is supplied to the source of the pMOS transistor Q13. The drain of the pMOS transistor Q13 is connected to the VPU node. The output of the NAND gate G2 is supplied to the gate of the nMOS transistor Q11 and is also supplied to the gate of the nMOS transistor Q12 via an inverter INV9. The output of the inverter INV9 is also supplied to the VPU node via a capacitor C2.

When the output enable signal /OE is low and when the data is low, the output of the NAND gate G2 is high. Therefore, the nMOS transistor Q11 is turned on and the nMOS transistor Q12 is turned off. Since the nMOS transistor Q11 is turned on, the gates of the pMOS transistor Q10 and the nMOS transistor Q13 are connected to the ground potential so that the pMOS transistor Q10 and the pMOS transistor Q13 are turned on. The voltage VCC is supplied to the VPU node via the pMOS transistor Q13. Since the output of the inverter INV9 is low, charge is built up in the capacitor C2.

When the data goes high, the output of the NAND gate G2 goes low. Therefore, the nMOS transistor Q12 is turned on and the nMOS transistor Q11 is turned off. Since the nMOS transistor Q12 is turned on, the gate of the pMOS transistor Q9 is connected to the ground potential so that the nMOS transistor Q9 is turned on. The voltage at the VPU node occurs at the drain of the pMOS transistor Q9 and is supplied to the gate of the pMOS transistor Q13 so that the pMOS transistor Q13 is turned off. Accordingly, the VPU node is disconnected from the voltage VCC. The output of the inverter INV9 goes high (the voltage VCC). A sum of the output of the inverter INV9 and the charge built up in the capacitor C2 is supplied to the VPU node. Thus, the step-up voltage VCC+VC (the charge voltage of the capacitor) is output to the VPU node.

Figure 10:
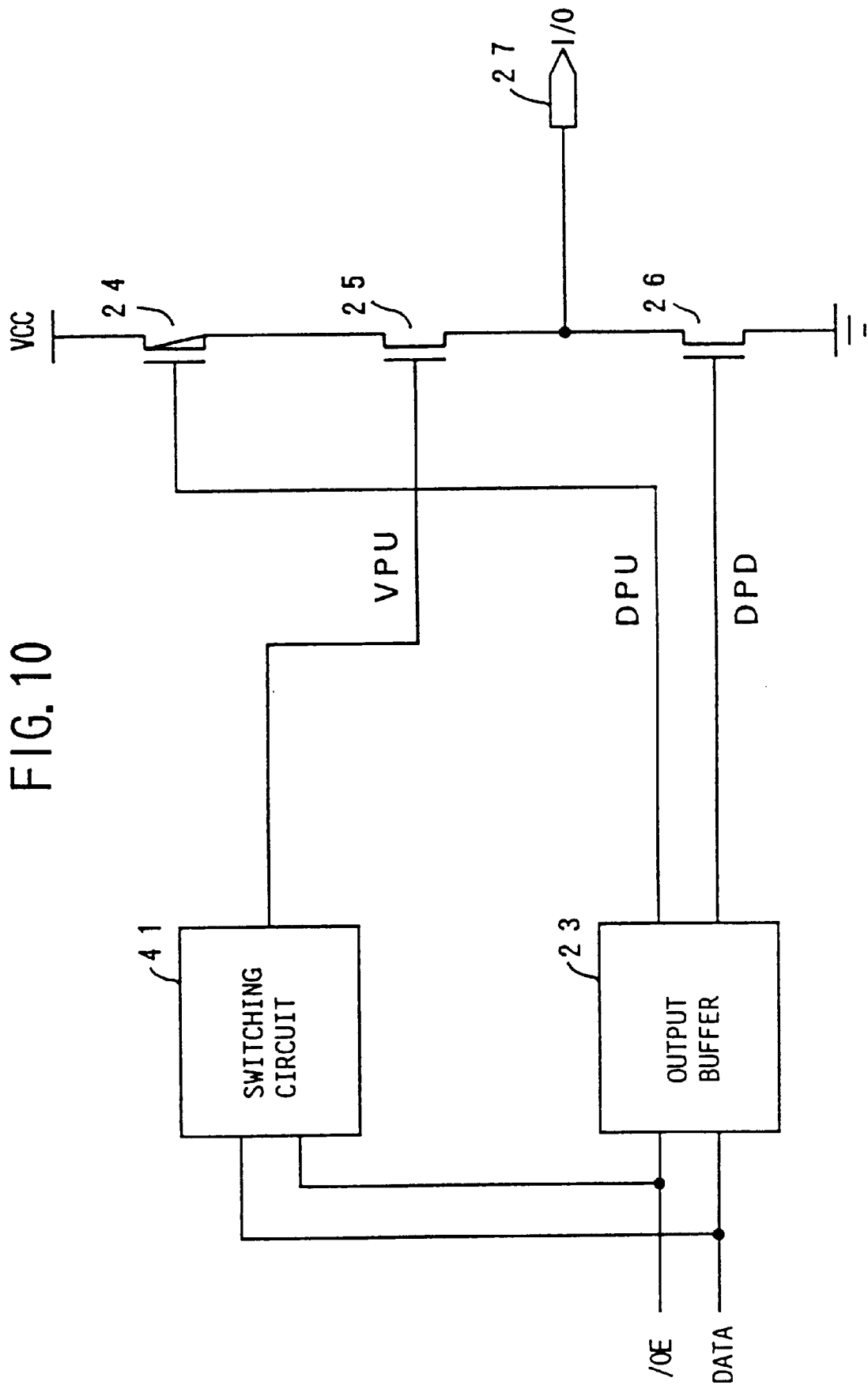
FIG. 10 is a block diagram showing an output driver circuit according to a third embodiment of the present invention.

FIG. 10 is a block diagram showing an output driver circuit of a semiconductor device according to a third embodiment of the present invention. In FIG. 10, those components that correspond to the components of FIG. 3 are designated by the same reference numerals and the description thereof is omitted.

A switching circuit 41 operates responsive to the output enable signal /OE and the data. When the output enable signal /OE is low and the data is high, the switching circuit 41 disconnects the VPU node from the voltage VCC. That is, the switching circuit 41 disconnects the gate of the pull-up nMOS transistor 25 from the voltage VCC when the high data is output. In this state, when the pMOS transistor 24 is turned on, the gate of the pull-up nMOS transistor 25 is stepped up due to a self-boost action. The self-boost action is derived from parasitic capacitance between the source of the pull-up nMOS transistor 25 and the gate thereof.

Since the output driver circuit according to the third embodiment is not provided with a step-up circuit, the area occupied by the output driver circuit is reduced.

Figure 12:
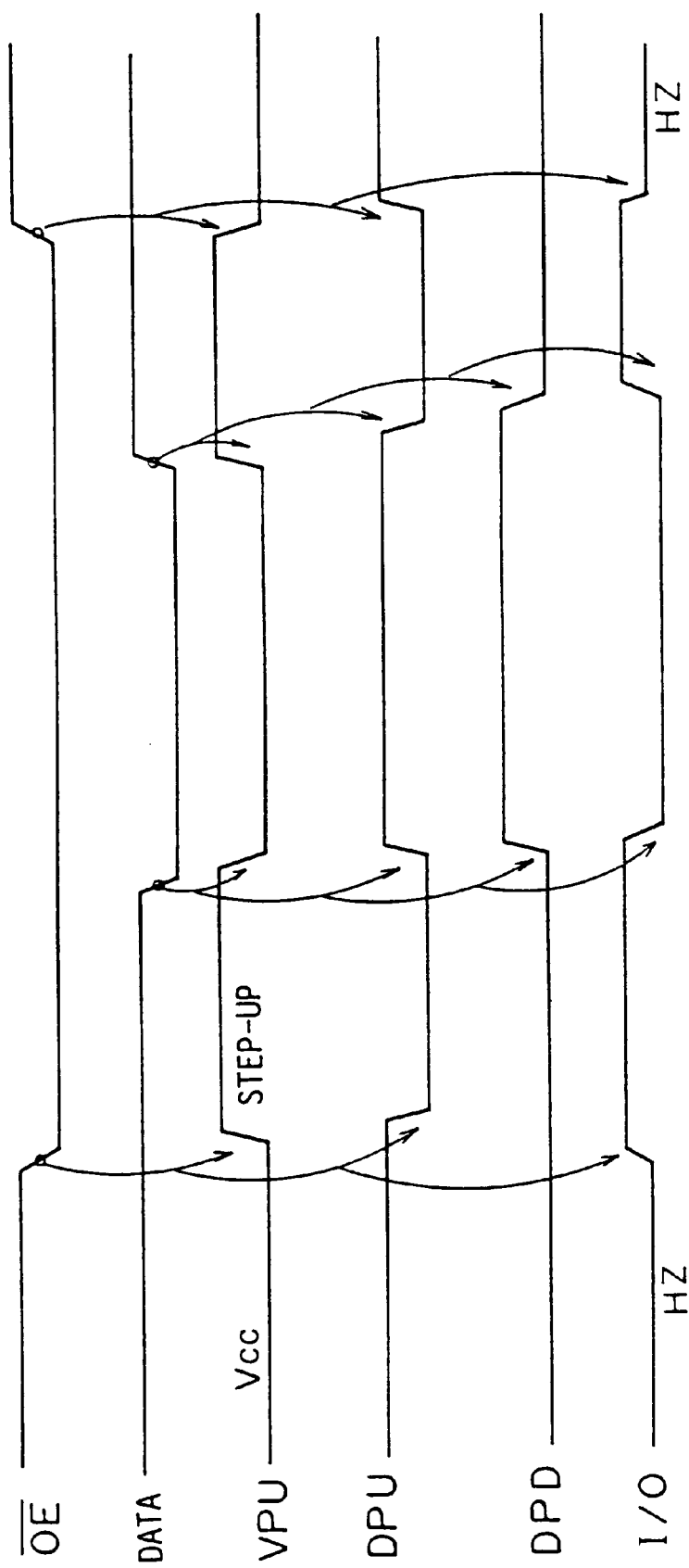
FIG. 12 is a waveform chart showing an operation of the output driver circuit of FIG. 10.

FIG. 12 is a waveform chart showing an operation of the output driver circuit of FIG. 10.

When the data is high and the output enable signal /OE is low, the voltage at the DPU node is low so that the pull-up nMOS transistor 24 is turned on and the switching circuit 41 (described later with reference to FIG. 11) disconnects the VPU node from the voltage VCC. Since the pull-up pMOS transistor 24 is turned on, the gate voltage (voltage at the VPU node) of the pull-up nMOS transistor 25 is raised to the step-up voltage due to the self-boost action. Accordingly, the high data is supplied to the input/output terminal 27. When the data goes low, the voltage at the DPU node goes high so that the pull-up pMOS transistor 24 is turned off. Simultaneously, the voltage at the DPD node goes high so that the pull-down nMOS transistor 26 is turned on. Accordingly, the low data is supplied to the input/output terminal 27.

Figure 11:
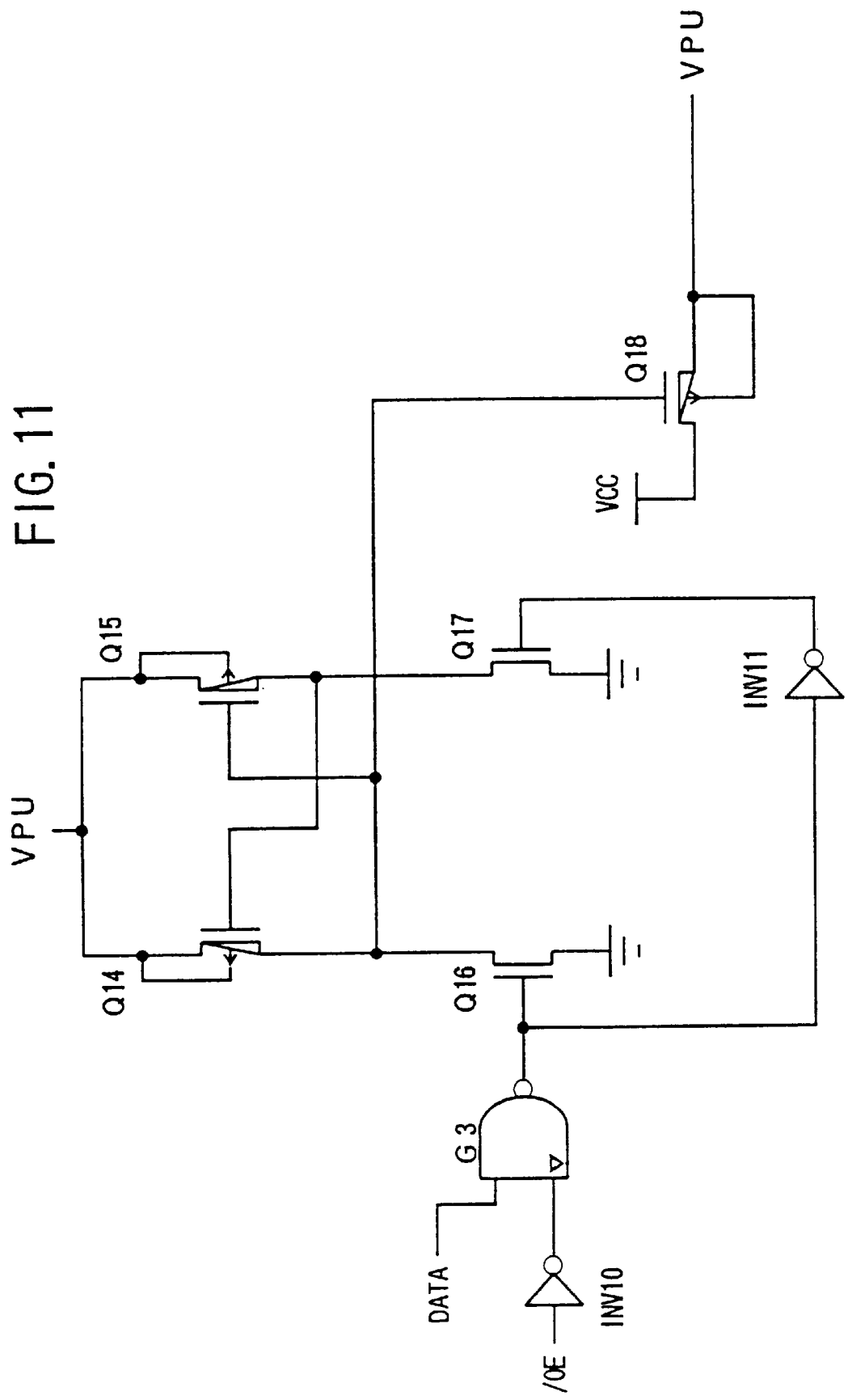
FIG. 11 shows a switching circuit of the output driver circuit of FIG. 10.

FIG. 11 shows a construction of the switching circuit 41 of FIG. 10. The data signal is supplied to one of the inputs of a NAND gate G3. The output enable signal /OE constitutes the other input to the NAND gate G3. An nMOS transistor Q16 and a pMOS transistor Q14 are connected in series such that source of the nMOS transistor Q16 is grounded. An nMOS transistor Q17 and a pMOS transistor Q15 are connected in series such that the source of the nMOS transistor Q17 is grounded. The gate of the pMOS transistor Q14 is connected to the drains of the pMOS transistor Q15 and the nMOS transistor Q17 connected in series. The gate of the pMOS transistor Q15 is connected to the drains of the pMOS transistor Q14 and the nMOS transistor Q16 connected in series and is also connected to the gate of a pMOS transistor Q18. The source of the pMOS transistor Q14 and the source of the pMOS transistor Q15 are connected to the VPU node. The voltage VCC is supplied to the source of the pMOS transistor Q18. The drain of the pMOS transistor Q18 is connected to the VPU node. The output of the NAND gate G3 is supplied to the gate of the nMOS transistor Q16 and is supplied to the gate of the nMOS transistor Q17 via an inverter INV11.

When the output enable signal /OE is low and when the data is low, the output of the NAND gate G3 is high. Therefore, the nMOS transistor Q16 is turned on and the nMOS transistor Q17 is turned off. Since the nMOS transistor Q16 is turned on, the gates of the pMOS transistor Q15 and the pMOS transistor Q18 are connected to the ground potential so that the pMOS transistor Q15 and the pMOS transistor Q18 are turned on. The voltage VCC is supplied to the VPU node via the pMOS transistor Q18.

When the data goes high, the output of the NAND gate G3 goes low. Therefore, the nMOS transistor Q17 is turned on and the nMOS transistor Q16 is turned off. Since the nMOS transistor Q17 is turned on, the gate of the pMOS transistor Q14 is connected to the ground potential so that the pMOS transistor Q14 is turned on. Accordingly, the voltage at the VPU node occurs at the drain of the pMOS transistor Q14 and is supplied to the gate of the pMOS transistor Q18 so that the pMOS transistor Q18 is turned off. Thus, the VPU node is disconnected from the voltage VCC. As described earlier, by turning on the pull-up pMOS transistor 24, the gate voltage (the voltage at the VPU node) of the pull-up nMOS transistor 25 is raised to the step-up voltage due to the self-boost action.

FIG. 13 shows a construction of a semiconductor device to which the output driver according to the second embodiment or the third embodiment is applied.

In FIG. 13, a memory is used as an example of the semiconductor device to which the output driver according to the second embodiment or the third embodiment is applied. In FIG. 13, those components that correspond to the components of FIGS. 7 and 10 are designated by the same reference numerals and the description thereof is omitted.

The memory of FIG. 13 comprises a control circuit 51 for controlling the operation of the memory; a chip enable/ output enable circuit 52 for outputting a chip enable signal and an output enable signal described in the embodiments; a memory cell 53 for storing information; an X-decoder 54 for accessing transistors constituting the memory cell 53 and connected in the X direction, in accordance with a control signal and a designated address supplied from the control circuit 51; a data latch circuit 55 for latching data from the memory cell 53; an RY, /BY buffer for outputting an RY signal and a /BY signal; a deletion circuit 57 for deleting data in the memory cell 53; a write circuit 58 for supplying a write signal to the memory cell 53; a write/deletion pulse timer 59 for supplying a pulse for controlling the timing of writing and deletion; a source current controlling circuit 60 for controlling a current to be supplied to the source of the transistors constituting the memory cell 53; an input buffer 61 for receiving data from external devices (not shown); a Y-gate 62 for supplying a signal common to transistors constituting the memory cell 53 and connected in the Y direction; a Y-decoder 63 for accessing, via the Y-gate 62, the transistors constituting the memory cell 53 and connected in the Y direction, in accordance with a control signal and a designated address supplied from the control circuit 51; and an address latch circuit 64 for latching an address supplied from the control circuit 51.

The data obtained via the input/output terminal 27 and the input buffer 61 is latched in the data latch circuit 55 and is written to the memory cell 53 via the Y-gate 63 under the control of the control circuit 51.

In a read mode, under the control of the control circuit 51, the data latch circuit 55 supplies the data obtained from the memory cell 53 to the output driver circuit via the Y-gate. Responsive to the data from the memory cell 53 and the output enable signal (OEB in FIG. 13), the switching circuit 41 alone (in the case of the third embodiment) or a combination of the switching circuit 41 and the step-up circuit 32 (in the case of the second embodiment) controls the transistors that constitute the output driver circuit. Difference in operation occurring when the data is high and when the data is low has already been described and is not repeated here. In FIG. 13, illustration of the transistors constituting the output driver is omitted.

The present invention is not limited to the above described embodiments, and variations and modifications may be made without departing from the scope of the present invention.

What is claimed is:

1. A semiconductor device provided with an output driver circuit having a pull-up pMOS transistor and a pull-down nMOS transistor, said semiconductor device comprising:

an nMOS transistor connected between said pull-up pMOS transistor and an output; and a step-up circuit for stepping up a gate voltage of said nMOS transistor only when high data is to be output.

2. The semiconductor device as claimed in claim 1, wherein said step-up circuit steps up the gate voltage of said nMOS transistor when high data is to be output, before said pull-up pMOS transistor is turned on.

3. The semiconductor device as claimed in claim 1, wherein said step-up circuit comprises:

a step-up circuit activated in a chip active mode so as to output a step-up voltage; and a switching circuit for delivering the step-up voltage output by said step-up circuit to the gate of said nMOS transistor, in accordance with an output enable signal.

4. The semiconductor device as claimed in claim 3, wherein the step-up circuit of said step-up circuit steps up the gate voltage of said nMOS transistor only when high data is to be output.

5. The semiconductor device as claimed in claim 1, wherein said step-up circuit comprises a gate voltage switching circuit for switching between first and second outputs depending on output of one of high data and low data, and said nMOS transistor between said pMOS transistor and the output is self-boosted when the high data is to be output.

6. A semiconductor memory device comprising:

a memory cell for storing information;

a control circuit for controlling storage of the information in said memory cell;

a data latch circuit for latching data from said memory cell in accordance with a control signal form said control circuit; and an output driver circuit composed of a pull-up pMOS transistor and an pull-down nMOS transistor, for outputting data supplied via said data latch circuit to an external semiconductor device, wherein said semiconductor memory device further comprises an nMOS transistor connected between said pull-up pMOS transistor and an output, and a step-up circuit for stepping up a gate voltage of said nMOS transistor when high data is to be output.

* * * * *